(12) United States Patent
Chiu et al.

(10) Patent No.: US 9,368,503 B2
(45) Date of Patent: Jun. 14, 2016

(54) SEMICONDUCTOR SRAM STRUCTURES

(71) Applicant: Semiconductor Manufacturing International Corp., Shanghai (CN)

(72) Inventors: Tzu-Yin Chiu, Shanghai (CN); Juilin Lu, Shanghai (CN); Jianxiang Cai, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 0 days.

(21) Appl. No.: 13/890,278

(22) Filed: May 9, 2013

(65) Prior Publication Data

US 2014/0103445 A1   Apr. 17, 2014

(30) Foreign Application Priority Data

Oct. 16, 2012   (CN) .......................... 2012 1 0393117

(51) Int. Cl.
*H01L 27/11* (2006.01)
*H01L 27/02* (2006.01)
*H01L 27/088* (2006.01)
*H01L 27/092* (2006.01)
*H01L 21/8234* (2006.01)

(52) U.S. Cl.
CPC ........ *H01L 27/11* (2013.01); *H01L 21/823475* (2013.01); *H01L 27/0207* (2013.01); *H01L 27/088* (2013.01); *H01L 27/092* (2013.01); *H01L 27/1104* (2013.01)

(58) Field of Classification Search
CPC ................ H01L 27/11; H01L 27/0207; H01L 21/823475; H01L 27/1104; H01L 27/08
USPC ......................................................... 257/401
See application file for complete search history.

(56) References Cited

U.S. PATENT DOCUMENTS

| 2002/0153589 | A1* | 10/2002 | Oh ................................. 257/532 |
| 2004/0178516 | A1* | 9/2004 | Ogata ............................ 257/903 |
| 2007/0241411 | A1 | 10/2007 | Yang et al. |
| 2009/0032847 | A1* | 2/2009 | Tomita ........................... 257/211 |
| 2009/0108379 | A1* | 4/2009 | Oosuka et al. ................. 257/412 |
| 2009/0303602 | A1* | 12/2009 | Bright et al. .................. 359/585 |

FOREIGN PATENT DOCUMENTS

CN   1855472 A   11/2006

* cited by examiner

*Primary Examiner* — Kevin Parendo
(74) *Attorney, Agent, or Firm* — Anova Law Group, PLLC

(57) ABSTRACT

Various embodiments provide semiconductor structures and their fabrication methods. An SRAM memory cell can include at least one semiconductor structure, and an SRAM memory can include at least one SRAM memory cell. An exemplary semiconductor structure can include at least two adjacent transistors formed on a semiconductor substrate. An opening can be formed and surrounded by gates of the two adjacent transistors and a doped region formed between the gates of the two adjacent transistors. A conductive layer can be formed to at least partially cover a bottom and a sidewall of the opening to electrically connect a gate of one transistor with the doped region of the other transistor of the two adjacent transistors.

9 Claims, 8 Drawing Sheets

SEMICONDUCTOR SRAM STRUCTURES

CROSS-REFERENCES TO RELATED APPLICATIONS

This application claims the priority to Chinese Patent Application No. CN201210393117.1, filed on Oct. 16, 2012, which is incorporated herein by reference in its entirety.

FIELD OF THE DISCLOSURE

The present disclosure relates to the field of semiconductor fabrication and, more particularly, relates to a semiconductor structure and fabrication method, static random access memory (SRAM) memory cells, and SRAM memory.

BACKGROUND

Static Random Access Memory (SRAM) is widely used in areas such as personal computers, personal communications, and consumer electronics products (e.g., digital cameras).

FIGS. 1-2 respectively depict a circuit diagram and a plan view of a conventional memory cell in a six-transistor (6T) SRAM memory. The memory cell includes a first PMOS transistor P1, a second PMOS transistor P2, a first NMOS transistor N1, a second NMOS transistor N2, a third NMOS transistor N3 and a fourth NMOS transistor N4. The first PMOS transistor P1, the second PMOS transistor P2, the first NMOS transistor N1, and the second NMOS transistor N2 form a bistable circuit. The bistable circuit forms a latch for latching data information. The first PMOS transistor P1 and the second PMOS transistor P2 are pull-up transistors. The first NMOS transistor N1 and the second NMOS transistor N2 are pull-down transistors. The third NMOS transistor N3 and the fourth NMOS transistor N4 are transfer transistors.

A gate of the first PMOS transistor P1, a gate of the first NMOS transistor N1, a drain of the second PMOS transistor P2, a drain of the second NMOS transistor N2 and a source of the fourth NMOS transistor N4 are electrically connected to form a first storage node 11. A gate of the second PMOS transistor P2, a gate of the second NMOS transistor N2, a drain of the first PMOS transistor P1, a drain of the first NMOS transistor N1, and a source of the third NMOS transistor N3 are electrically connected to form a second storage node 12. Gates of the third NMOS transistor N3 and the fourth NMOS transistor N4 are electrically connected to a word line WL. A drain of the third NMOS transistor N3 is electrically connected to a first bit line BL. A drain of the fourth NMOS transistor N4 is electrically connected to a second bit line (complementary bit line) BLB. A source of the first PMOS transistor P1 and a source of the second PMOS transistor P2 are electrically connected to a power supply line Vdd. A source of the first NMOS transistor N1 and a source of the second NMOS transistor N2 are electrically connected to a ground line Vss.

When the SRAM memory is in a read operation, a current flows from the first bit line BL and the second bit line BLB that are at a high voltage level to the first storage node 11 or the second storage node 12 that is at a low voltage level. When the SRAM memory is in a write operation, a current flows from one of the first storage node 11 and the second storage node 12 that is at a high voltage level to one of the first bit line BL and the second bit line BLB that is at a low voltage level.

In conventional technologies, in order to connect a gate, a source or a drain of a transistor, a connection plug is usually provided on top of the gate, the source or the drain. The connection plug is used to lead out the gate, the source, or the drain for connecting with another device.

FIG. 3 depicts a cross-sectional view of a transistor used in a conventional SRAM memory. The transistor includes a semiconductor substrate 10, and a gate formed on the semiconductor substrate 10. The gate includes a gate dielectric layer 116B, a gate electrode layer 118B and a contact layer 119B that are sequentially formed on the semiconductor substrate 10. The gate also includes sidewalls 122B formed on both sides of the gate dielectric layer 116B, the gate electrode layer 118B and the contact layer 119B. The transistor also includes a connection plug G formed on top of the gate electrode layer 118B. The connection plug G is formed in an interlayer dielectric layer 104 and is for leading out the gate electrode layer 118B of the transistor. However, the connection plug G occupies a relatively large portion of a space between transistors. Corresponding SRAM memories are thus generated with large sizes.

BRIEF SUMMARY OF THE DISCLOSURE

According to various embodiments, there is provided a semiconductor structure. The semiconductor structure can include a first transistor and a second transistor formed on a semiconductor substrate. The second transistor can include a doped region adjacent to a gate of the first transistor. The gate of the first transistor can include a gate electrode layer and an insulating layer formed on a first portion of the gate electrode layer. The insulating layer can expose a second portion of the gate electrode layer adjacent to the doped region. An opening can be formed and surrounded by the insulating layer, the exposed second portion of the gate electrode layer of the first transistor, the doped region of the second transistor and a gate of the second transistor. A conductive layer at least partially covering a bottom and a sidewall of the opening can be formed such that the gate of the first transistor is electrically connected with the doped region of the second transistor by the conductive layer.

According to various embodiments, there is also provided a method of forming a semiconductor structure. In this method, a first gate and a second gate can be formed on a semiconductor substrate. The first gate can include a gate electrode layer and an insulating layer formed on the gate electrode layer. A portion of the insulating layer of the first gate can be removed to have a remaining insulating layer on a first portion of the gate electrode layer and to expose a second portion of the gate electrode layer adjacent to the second gate. An opening can be formed and surrounded by the remaining insulating layer, the exposed second portion of the gate electrode layer, the semiconductor substrate between the first gate and the second gate, and the second gate. A conductive layer can be formed to at least partially cover a bottom and a sidewall of the opening. A doped region can be formed by doping the semiconductor substrate between the first gate and the second gate. The first gate can be electrically connected to the doped region by the conductive layer.

According to various embodiments, there is further provided an SRAM memory cell. The SRAM memory cell can include a first PMOS transistor; a second PMOS transistor; a first NMOS transistor; a second NMOS transistor; a third NMOS transistor; and a fourth NMOS transistor. A first insulating layer can be disposed on a first portion of a gate electrode layer of the first PMOS transistor to expose a second portion of the gate electrode layer of the first PMOS transistor adjacent to a drain of the second PMOS transistor. A first opening can be formed and surrounded by the first insulating layer, the exposed second portion of the gate electrode layer, the drain of the second PMOS transistor, and a gate of the second PMOS transistor. A first conductive layer at least partially covering a bottom and a sidewall of the first opening can be included for electrically connecting the gate of the first PMOS transistor with the drain of the second PMOS transistor.

It is to be understood that both the foregoing general description and the following detailed description are exemplary and explanatory only and are not restrictive of the invention, as claimed. Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Various embodiments provide a semiconductor structure, a method of forming the semiconductor structure, an SRAM memory cell, and an SRAM memory. Electrical connection between electrodes of transistors in each of the semiconductor structure, the SRAM memory cell, and the SRAM memory can be achieved via one or more conductive layers, without using connection plugs. Thus, the space originally reserved for connection plugs between transistors can be saved. Accordingly, the occupied area of corresponding SRAM memory cells can be reduced. In addition, by using conductive layer(s), SRAM memory cell size can be significantly reduced due to a reduced number of contacts and a reduced overlap area (OVL) between an active area and a corresponding gate.

An exemplary semiconductor structure can include at least two adjacent transistors formed on a semiconductor substrate. An opening can be formed and surrounded by gates of the two adjacent transistors and a doped region formed between the gates of the two adjacent transistors. A conductive layer can be formed to at least partially cover a bottom and a sidewall of the opening to electrically connect a gate of one transistor with the doped region of the other transistor of the two adjacent transistors.

Figure 1:
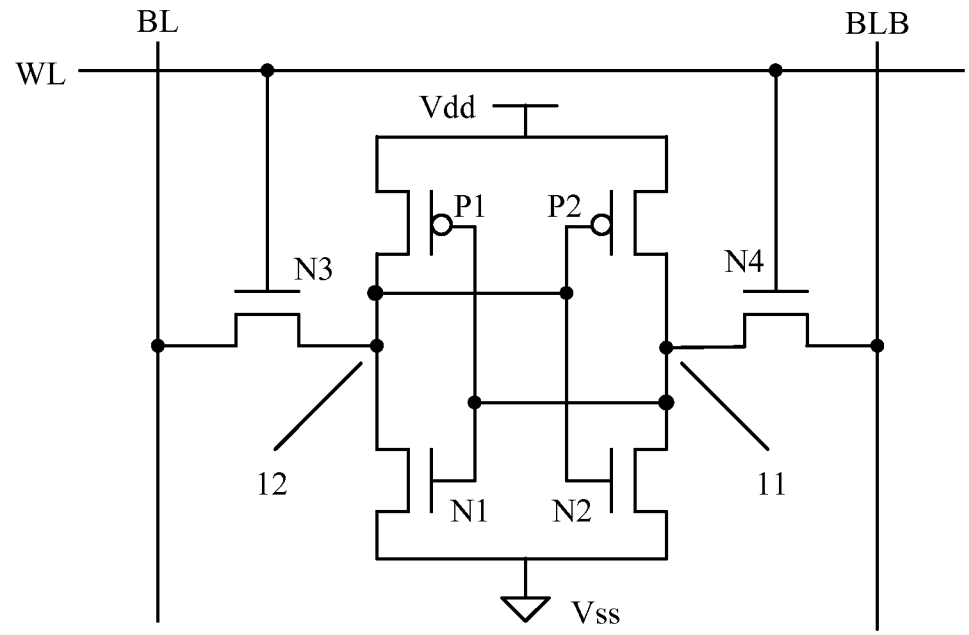
FIG. 1 depicts a circuit diagram of a memory cell of a conventional SRAM memory.
Figure 2:
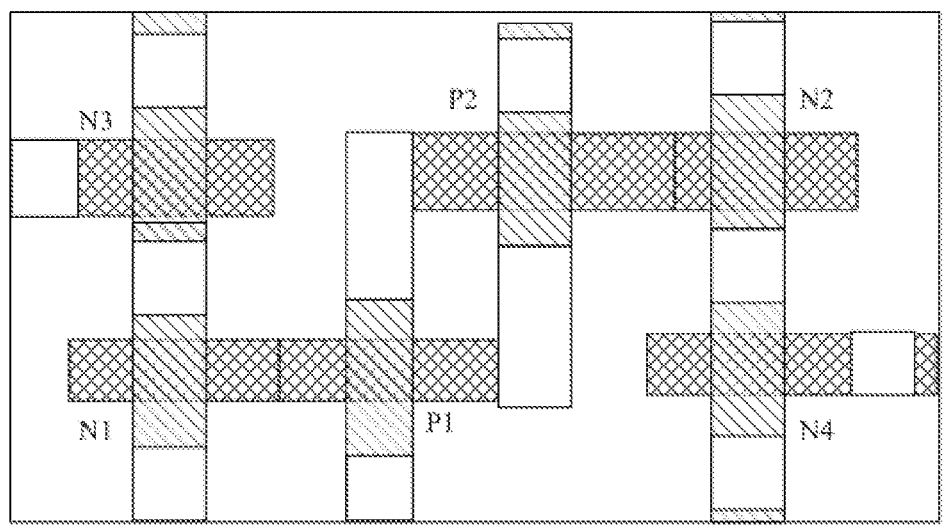
FIG. 2 depicts a plan view of a conventional SRAM memory cell.
Figure 3:
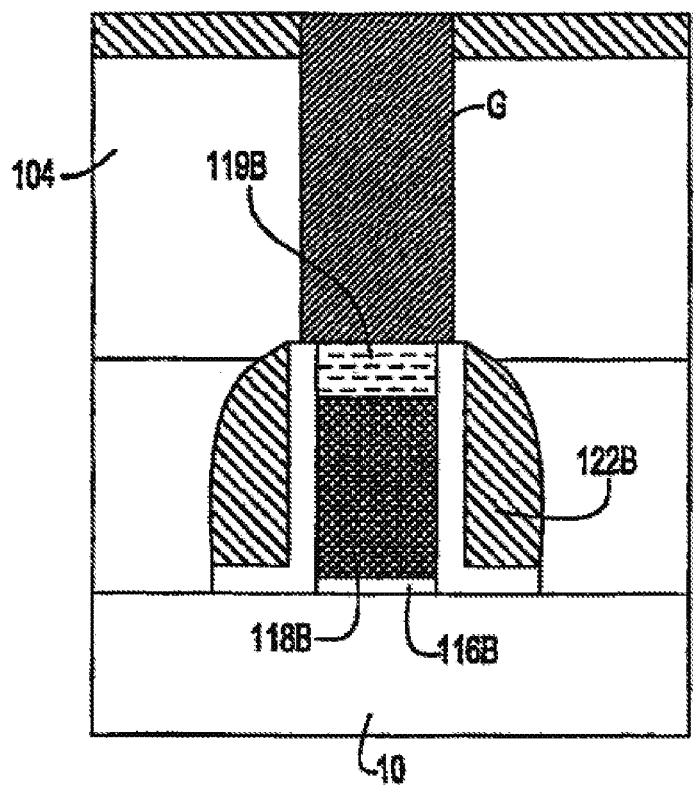
FIG. 3 depicts a cross-sectional view of a transistor in a conventional SRAM memory cell.
Figure 4:
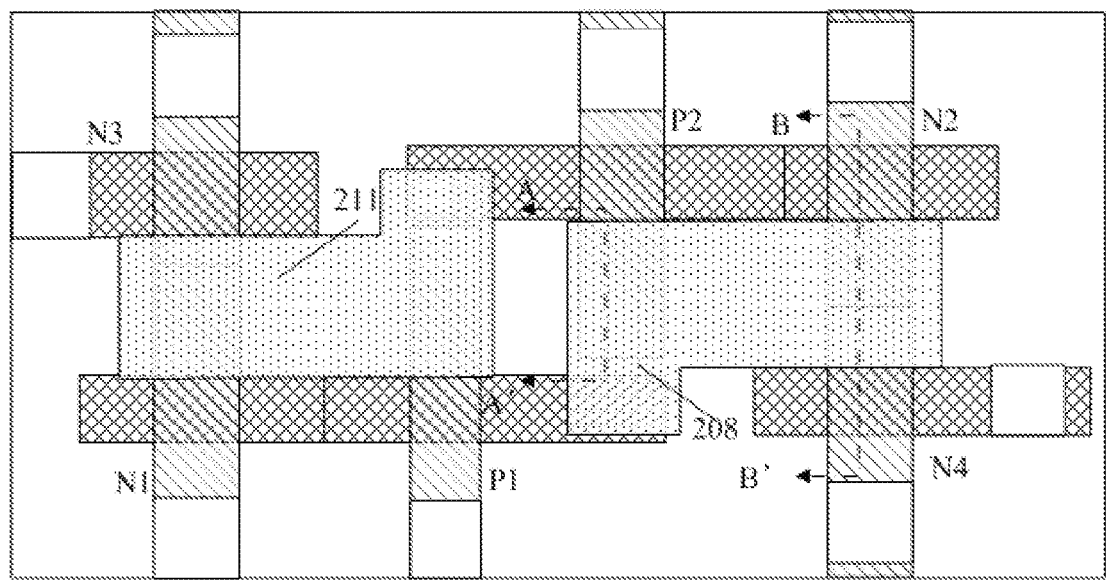
FIG. 4 depicts a plan view of an SRAM memory cell in accordance with various disclosed embodiments.
Figure 5:
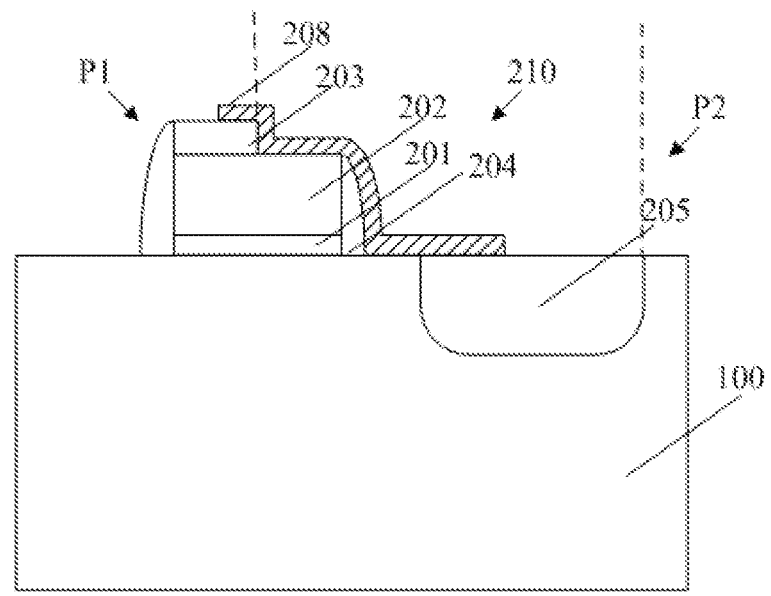
FIG. 5 depicts a cross-sectional view along section line AA' in FIG. 4 in accordance with various disclosed embodiments.
Figure 6:
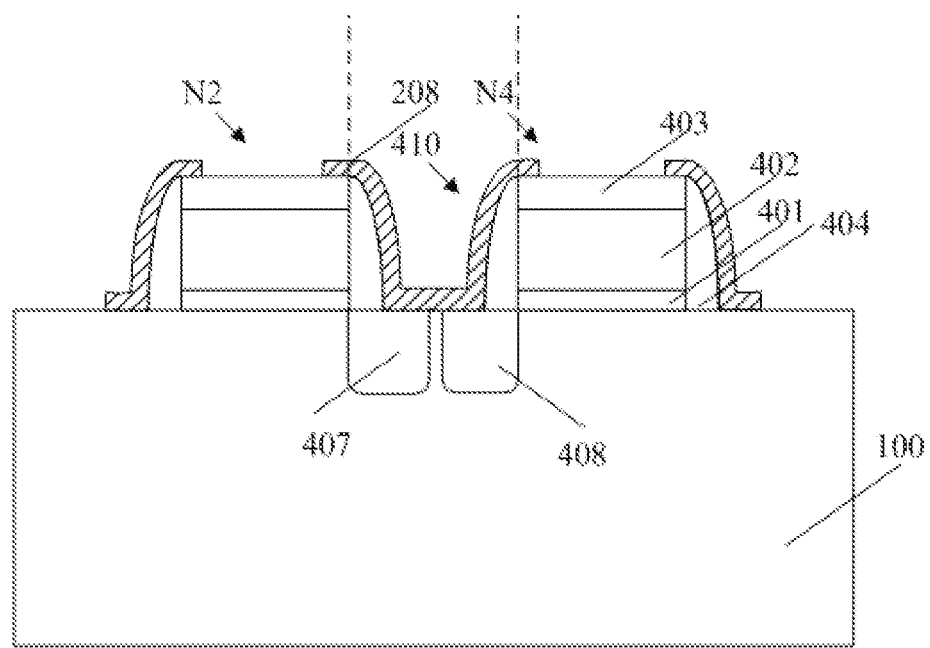
FIG. 6 depicts a cross-sectional view along section line BB' in FIG. 4 in accordance with various disclosed embodiments.

FIG. 4 depicts a plan view of an exemplary SRAM memory cell, while FIGS. 5-6 respectively depict a cross-sectional view along section line AA' and a cross-sectional view along section line BB' of the SRAM memory cell in FIG. 4 in accordance with various disclosed embodiments.

The exemplary SRAM memory cell in FIG. 4 can include transistors including, for example, a first PMOS transistor P1, a second PMOS transistor P2, a first NMOS transistor N1, a second NMOS transistor N2, a third NMOS transistor N3, and/or a fourth NMOS transistor N4. The first PMOS transistor P1, the second PMOS transistor P2, the first NMOS transistor N1 and the second NMOS transistor N2 can form a bistable circuit. The bistable circuit can form a latch for latching data information.

The first PMOS transistor P1 and the second PMOS transistor P2 can be pull-up transistors. The first NMOS transistor N1 and the second NMOS transistor N2 can be pull-down transistors. The third NMOS transistor N3 and the fourth NMOS transistor N4 can be transfer transistors.

Gates of the third NMOS transistor N3 and the fourth NMOS transistor N4 can be electrically connected to a word line WL (not shown). A drain of the third NMOS transistor N3 can be electrically connected to a first bit line BL (not shown). A drain of the fourth NMOS transistor N4 can be electrically connected to a second bit line (not shown) BLB. A source of the first PMOS transistor P1 and a source of the second PMOS transistor P2 can be electrically connected to a power supply line Vdd (not shown). A source of the first NMOS transistor N1 and a source of the second NMOS transistor N2 can be electrically connected to a ground line Vss (not shown).

As disclosed, a first conductive layer 208 can be provided to electrically connect the gate of the first PMOS transistor P1, the gate of the first NMOS transistor N1, the drain of the second PMOS transistor P2, the drain of the second NMOS transistor N2, with the source of the fourth NMOS transistor N4 to form the first storage node.

Specifically, as depicted in FIG. 4, the gate of the first PMOS transistor P1 and the gate of the first NMOS transistor N1 can be placed together or otherwise in contact with each other. Therefore, the gate of the first PMOS transistor P1 and the gate of the first NMOS transistor N1 can be electrically connected. One end of the gate of the first PMOS transistor P1 that is not in contact with the gate of the first NMOS transistor N1 can be extended to a position intersecting with the drain of the second PMOS transistor P2.

FIG. 5 depicts a schematic cross-sectional view of an exemplary semiconductor structure along section line AA' of FIG. 4. As shown, the exemplary semiconductor structure can include the gate of the first PMOS transistor P1 and the drain of the second PMOS transistor P2.

The gate of the first PMOS transistor P1 can include a gate dielectric layer 201, a gate electrode layer 202, an insulating layer 203, and a sidewall spacer 204. The gate dielectric layer 201, the gate electrode layer 202 and the insulating layer 203 can be formed on a semiconductor substrate 100. The sidewall spacer 204 can be formed surrounding each of the gate dielectric layer 201, the gate electrode layer 202 and the insulating layer 203. Each of the gate dielectric layer 201, the insulating layer 203 and the sidewall spacer 204 can be made of a same or different insulating material. For example, the gate dielectric layer 201 may be made of silicon oxide; while the insulating layer 203 and the sidewall spacer 204 may be made of silicon nitride. The gate electrode layer 202 can be made of a conductive material. For example, the gate electrode layer 202 can be made of polycrystalline silicon. The gate electrode layer 202 can be used for electrical connection of the gate of the first PMOS transistor P1.

The drain of the second PMOS transistor P2 can be formed on a side of the sidewall spacer 204 of the first PMOS transistor P1. For example, the drain of the second PMOS transistor P2 can be a P-type doped region 205 formed in the semiconductor substrate 100.

In the gate of the first PMOS transistor P1, the insulating layer 203 can be formed on the gate electrode layer 202 covering a first portion of the gate electrode layer 202 that is far away from the P-type doped region 205, and exposing a second portion of the gate electrode layer 202 that is close to the P-type doped region 205 of the second PMOS transistor P2. This can allow an opening 210 to be formed and surrounded by the insulating layer 203, the second portion of the gate electrode layer 202 of the first PMOS transistor P1 exposed by the insulating layer 203, the P-type doped region 205 of the second PMOS transistor P2, and a gate (not shown) of the second PMOS transistor P2.

A bottom and a sidewall of the opening 210 can be at least partially covered by the first conductive layer 208, as shown in FIGS. 4-5. The first conductive layer 208 can at least electrically connect the drain (e.g., the P-type doped region 205) of the second PMOS transistor P2 with the gate (e.g., the gate electrode layer 202) of the first PMOS transistor P1.

Although the first conductive layer 208 shown in FIGS. 4-5 only covers a portion of the P-type doped region 205 for illustration purposes, the first conductive layer 208 may be formed to cover any portion, or the whole surface of the P-type doped region 205. In some cases, to cover the bottom and the sidewall of the opening 210, the first conductive layer 208 may cover a top surface and a sidewall of the insulating layer 203. Alternatively, the first conductive layer 208 may cover only the sidewall of the insulating layer 203.

In one embodiment, the first conductive layer 208 can be made of one or more materials including polycrystalline silicon, indium tin oxide, and the like. The first conductive layer 208 can have a suitable thickness, for example, between about 200 Å and about 800 Å. When the first conductive layer 208 is overly thick, it may be difficult to form a doped region therein, e.g., using an ion implantation. On the other hand, when the first conductive layer 208 is overly thin, it may reduce reliability of the electrical connection.

Referring back to FIG. 4, the first conductive layer 208 can also be extended between the drain of the second NMOS transistor N2 and a source of the fourth transistor N4. FIG. 6 depicts a cross-sectional view of an exemplary semiconductor structure along section line BB' of FIG. 4. The exemplary semiconductor structure can include the second NMOS transistor N2 and the fourth transistor N4.

The second NMOS transistor N2 and the fourth transistor N4 can be adjacent transistors formed on the semiconductor substrate 100. The second NMOS transistor N2 and the fourth NMOS transistor N4 can each include a gate, and a source and a drain that are formed on both sides of the gate.

The gates of the second NMOS transistor N2 and the fourth NMOS transistor N4 can each include a gate dielectric layer 401, a gate electrode layer 402, an insulating layer 403, and a sidewall spacer 404 surrounding each of the gate dielectric layer 401, the gate electrode layer 402 and the insulating layer 403. The gate dielectric layer 401, the gate electrode layer 402 and the insulating layer 403 can be sequentially formed on the semiconductor substrate 100.

In one embodiment, the sources and drains of the second NMOS transistor N2 and the fourth NMOS transistor N4 can be N-type doped regions. For example, a drain 407 of the second NMOS transistor N2 and a source 408 of the fourth NMOS transistor N4 can be formed between the two gates of the second NMOS transistor N2 and the fourth NMOS transistor N4. The N-type doped region that forms the drain 407 of the second NMOS transistor N2 and the N-type doped region that forms the source of the fourth NMOS transistor N4 can be configured adjacent to each other. However, in some other embodiments, the N-type doped region that forms the drain 407 of the second NMOS transistor N2 and the N-type doped region that forms the source of the fourth NMOS transistor N4 may share one common N-type doped region.

A second opening 410 can be formed and surrounded by the gates of the second NMOS transistor N2 and the fourth NMOS transistor N4, and the semiconductor substrate 100 between the second NMOS transistor N2 and the fourth NMOS transistor N4. The first conductive layer 208 can also cover a bottom and a sidewall of the second opening 410 to electrically connect the drain 407 of the second NMOS transistor N2 and the source 408 of the fourth NMOS transistor N4.

In the exemplary SRAM memory cell of FIG. 4, the gate of the first PMOS transistor P1 and the gate of the first NMOS transistor N1 can be electrically connected with each other via a direct contact. The gate of the first PMOS transistor P1, the drain of the second PMOS transistor P2, the drain of the second NMOS transistor N2, and the source of the fourth NMOS transistor N4 can be electrically connected with each other via the first conductive layer 208.

Still in FIG. 4, in order for the first conductive layer 208 to cover regions of the gate of the first PMOS transistor P1, the drain of the second PMOS transistor P2, the drain of the second NMOS transistor N2, and the source of the fourth NMOS transistor N4, the first conductive layer 208 can be formed having an L shape, or any other suitable shapes. For example, the first conductive layer 208 may have a suitable shape according to a position or a configuration of each of the first PMOS transistor P1, the second PMOS transistor P2, the second NMOS transistor N2, and the fourth NMOS transistor N4.

As disclosed above, the first conductive layer 208 can be used to electrically connect the gate of the first PMOS transistor P1 with the drain of the second PMOS transistor P2. The first conductive layer 208 can also be used to electrically connect the drain of the second NMOS transistor N2 and the source of the fourth NMOS transistor N4. However, in some other embodiments, the first conductive layer 208 can include a number of conductive layers used to, e.g., respectively electrically connect the gate of the first PMOS transistor P1 with the drain of the second PMOS transistor P2, and electrically connect the drain of the second NMOS transistor N2 with the source of the fourth NMOS transistor N4.

Still in FIG. 4, a second conductive layer 211 can be provided to electrically connect the gate of the second PMOS transistor P2, the gate of the second NMOS transistor N2, the drain of the first PMOS transistor P1, the drain of the first NMOS transistor N1, with the source of the third NMOS transistor N3 to form a second storage node. The gate of the second PMOS transistor P2 and the gate of the second NMOS transistor N2 can be configured in contact with each other and therefore can be electrically connected together.

Similar to the electrical connection using the first conductive layer 208, an insulating layer of the second PMOS transistor P2 can expose a portion of a gate electrode layer adjacent to the drain of the first PMOS transistor P1. A third opening (not shown) can be formed and surrounded by the insulating layer, the exposed portion of the gate electrode layer, the drain of the first PMOS transistor P1, and the gate of the first PMOS transistor P1. The second conductive layer 211 can at least partially cover a bottom and a sidewall of the third opening to electrically connect the gate of the second PMOS transistor P2 with the drain of the first PMOS transistor P1.

A fourth opening (not shown) can also be formed and surrounded by the gates of the first NMOS transistor N1 and the third NMOS transistor N3, the drain of the first NMOS transistor N1, and the source of the third NMOS transistor N3. The drain of the first NMOS transistor N1 and the source of the third NMOS transistor N3 can be formed between the gates of the first NMOS transistor N1 and the third NMOS transistor N3. The second conductive layer 211 can also at least partially cover a bottom and a sidewall of the fourth opening to electrically connect the drain of the first NMOS transistor N1 with the source of the third NMOS transistor N3.

The second conductive layer 211 can have an L shape or any other suitable shapes. The second conductive layer 211 may be made of one or more of materials including, e.g., polycrystalline silicon and indium tin oxide. The second conductive layer 211 can have a thickness in a range from about 200 Å to about 800 Å.

In this manner, corresponding electrodes can be electrically connected via the first conductive layer 208 and the second conductive layer 211 to form the first storage node and the second storage node, and thereby normal operation of the SRAM memory cell can be ensured. Connection plugs are not needed, and thus, distances between different transistors can be reduced. For example, distances between gates of adjacent transistors can be reduced to from about 2500 Å to about 1500 Å, for example, from about 2000 Å to about 1500 Å. In some cases, distances between gates of adjacent transistors can be reduced to less than 1500 Å.

As described herein, the SRAM memory cell is used as an example for illustration purposes. Modifications, variations and substitutions to the semiconductor structure depicted in FIGS. 5-6 can be made according to any other applications in the semiconductor field, when a semiconductor structure (in which a gate of a transistor and a doped region of another transistor need to be electrically connected to each other and/or a semiconductor structure in which doped regions of two transistors need to be electrically connected to each other) is used for the applications in the semiconductor field.

In various embodiments, an exemplary SRAM memory can contain at least one SRAM memory cell, e.g., as described above in FIGS. 4-6. The SRAM memory can thus have a reduced area due to use of the disclosed conductive layer(s). Various embodiments also provide methods for forming semiconductor structures.

Figure 14:
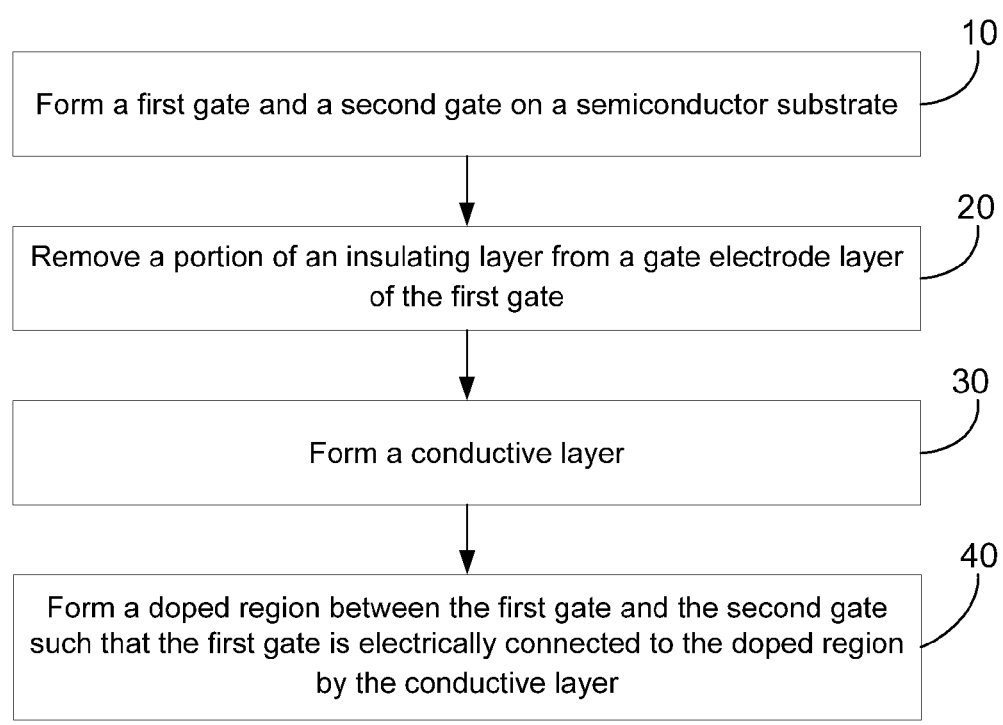
FIG. 14 depicts an exemplary method for forming a semiconductor structure in accordance with various disclosed embodiments.

FIG. 14 depicts an exemplary method for forming a semiconductor structure, e.g., as shown in FIG. 5, while FIGS. 7-10 depict a corresponding semiconductor structure at various stages during its formation in accordance with various disclosed embodiments.

Figure 7:
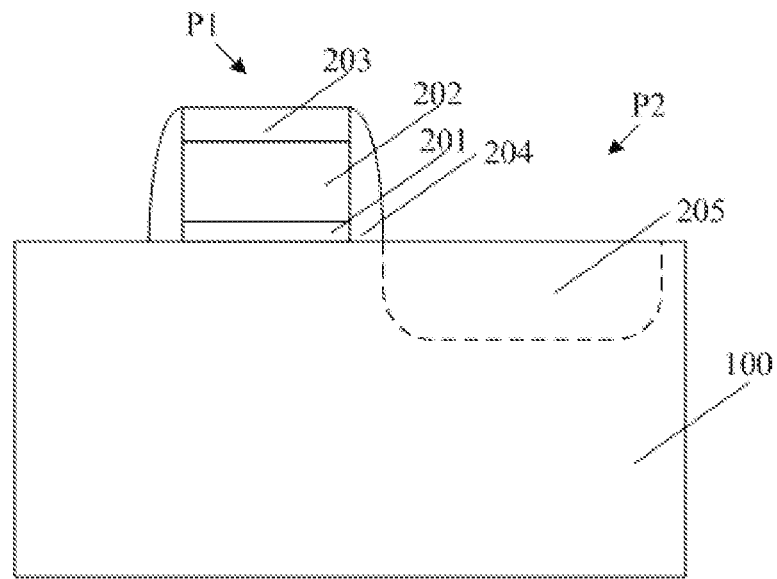
FIGS. 7-10 depict schematic diagrams of an exemplary method for forming a semiconductor structure in accordance with various disclosed embodiments.

In Step 10 of FIG. 14 and referring to FIG. 7, a semiconductor substrate 100 can be provided. The semiconductor substrate 100 may be made of silicon, germanium, or other Group III-V semiconductor materials. The semiconductor substrate 100 may also be made of silicon-on-insulator (SOI). A first gate and a second gate (not shown) can be formed on the semiconductor substrate 100, which can be respectively used to form a first transistor P1 and a second transistor P2.

The first gate can include a gate dielectric layer 201, a gate electrode layer 202, an insulating layer 203, and a sidewall spacer 204. The gate dielectric layer 201, the gate electrode layer 202, and the insulating layer 203 can be sequentially formed on the semiconductor substrate 100. The sidewall spacer 204 can be formed surrounding the gate dielectric layer 201, the gate electrode layer 202, and the insulating layer 203. In one example, the gate dielectric layer 201 can be made of silicon oxide; the insulating layer 203 and the sidewall spacer 204 can be made of silicon nitride; and the gate electrode layer 202 can be made of polycrystalline silicon.

A portion of the semiconductor substrate 100 exposed between the first gate and the second gate can be used to subsequently form a doped region 205 of a second transistor P2.

Figure 8:
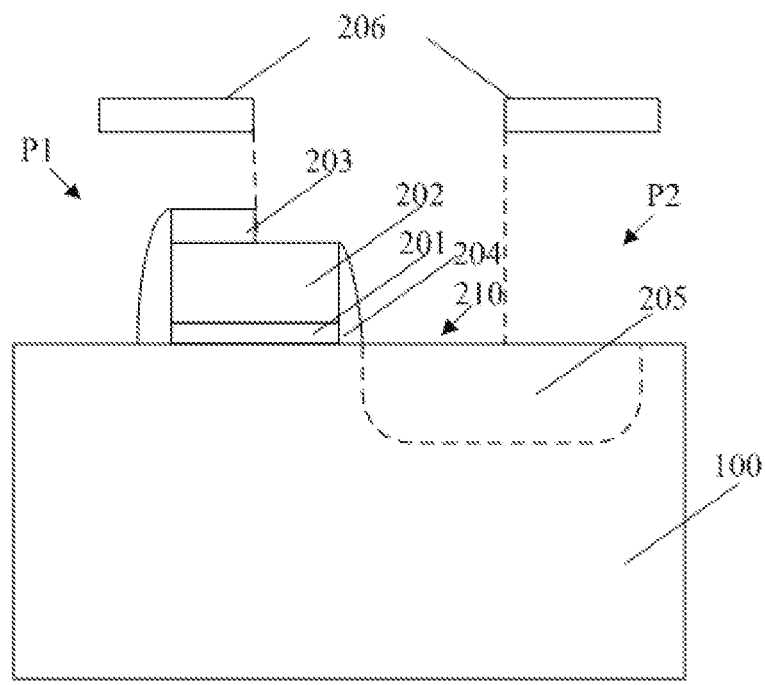

In Step 20 of FIG. 14 and referring to FIG. 8, a portion of the insulating layer 203 in the first gate that is adjacent to the second gate can be removed so that the remaining insulating layer 203 on a first portion of the gate electrode layer 202 can expose a second portion of the gate electrode layer 202 that is adjacent to the second gate. A first opening 210 can be formed and surrounded by the remaining insulating layer 203, the second portion of the gate electrode layer 202 that is exposed by the insulating layer 203, the semiconductor substrate 100 between the first gate and the second gate, and the second gate. In one embodiment, the remaining insulating layer 203 can be silicon nitride having a thickness ranging from about 500 Å to about 1500 Å. The remaining insulating layer 203 can provide isolation between the subsequently-formed conductive layer and a corresponding gate.

The portion of the insulating layer 203 can be removed by lithography and etching. For example, a photoresist pattern 206 can be formed on the first gate and the second gate. The photoresist pattern 206 can expose a portion of the insulating layer 203 on the second portion of the gate electrode layer 202 in the first gate that is adjacent to the second gate. Thereafter, plasma etching can be used to remove the portion of the insulating layer 203 that is exposed by the photoresist pattern 206. In one embodiment, the sidewall spacer 204 can be made of a material same as the insulating layer 203. When the portion of the insulating layer 203 is removed, a portion of the sidewall that is adjacent to the second gate may also be partially removed.

Figure 9:
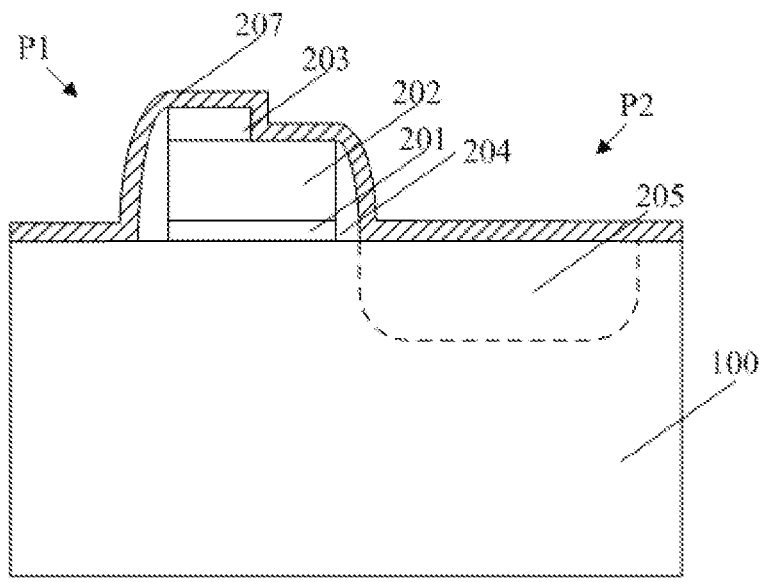

In Step 30 of FIG. 14 and referring to FIG. 9, a conductive layer 207 can be formed by depositing a conductive material on the first gate, the second gate, and the semiconductor substrate 100 exposed by the first gate and the second gate. For example, the conductive material may include one or more materials including polycrystalline silicon and indium tin oxide. In one embodiment, the conductive material can be polycrystalline silicon, which can be formed by using chemical vapor deposition.

A doped region 205 of the second transistor P2 needs to be subsequently formed between the first gate and the second gate. The conductive layer 207 can have a suitable thickness, for example, between about 200 Å and about 800 Å. When the conductive layer 207 is overly thick, it may be difficult to form a doped region therein, e.g., using an ion implantation. On the other hand, when the conductive layer 207 is overly thin, it may reduce reliability of the electrical connection.

Figure 10:
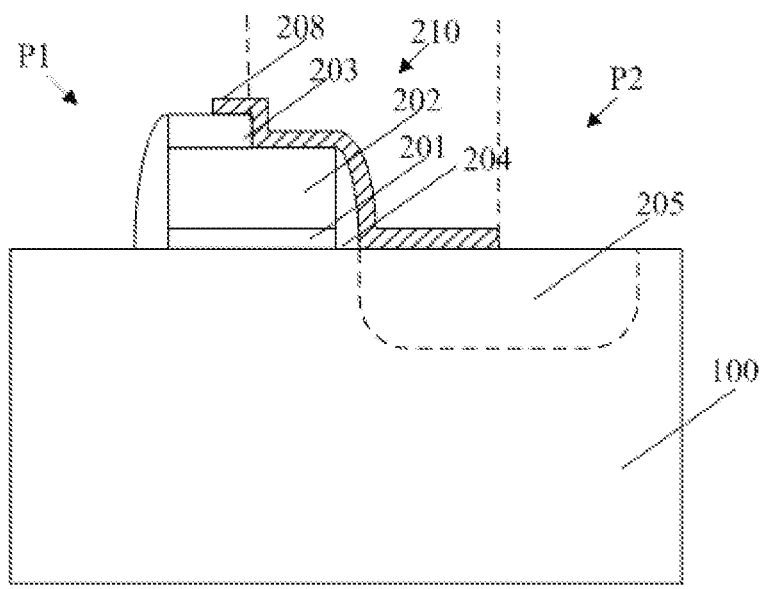

Still in Step 30 of FIG. 14 and referring to FIG. 10, a portion of the conductive layer 207 can be removed, e.g., by lithography and etching. The remaining conductive layer 207 can at least partially cover a bottom and a sidewall of the first opening 210. The remaining conductive layer 207 can form the first conductive layer 208 that can be used to electrically connect the gate of the first transistor P1 with the doped region of the second transistor P2 as depicted in FIGS. 4-6.

In Step 40 of FIG. 14, after the first conductive layer 208 is formed, the semiconductor substrate 100 between the first gate and the second gate can be subjected to an ion implantation to form the doped region 205. During the ion implantation, doping ions (or dopants) can pass through the first conductive layer 208 to reach the semiconductor substrate 100.

In this manner, the gate of the first transistor P1 and the doped region of the second transistor P2 can be electrically connected via the first conductive layer 208, without a need for using connection plugs. Therefore, the distance between the first transistor P1 and the second transistor P2 can be reduced.

Figure 11:
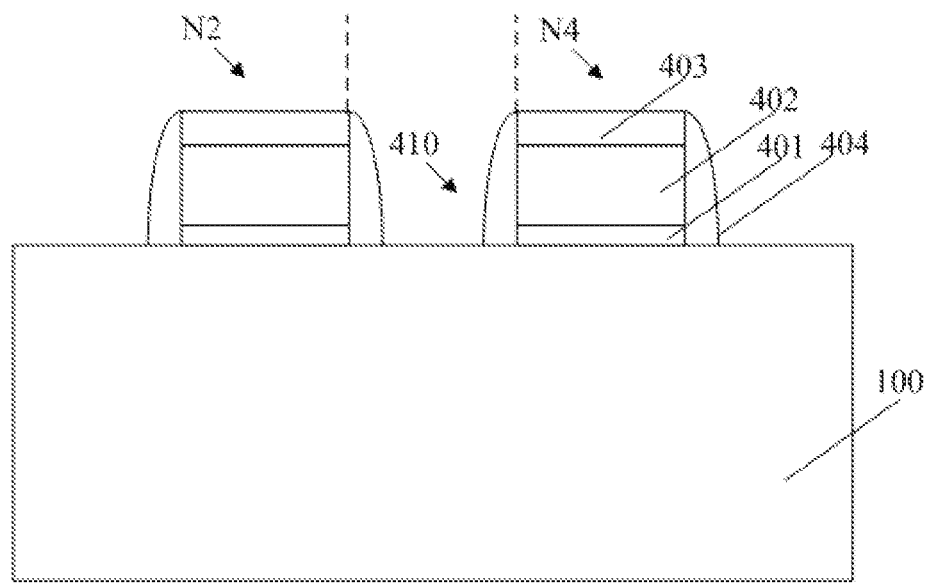
FIGS. 11-13 depict schematic diagrams of another exemplary method for forming a semiconductor structure in accordance with various disclosed embodiments.
Figure 12:
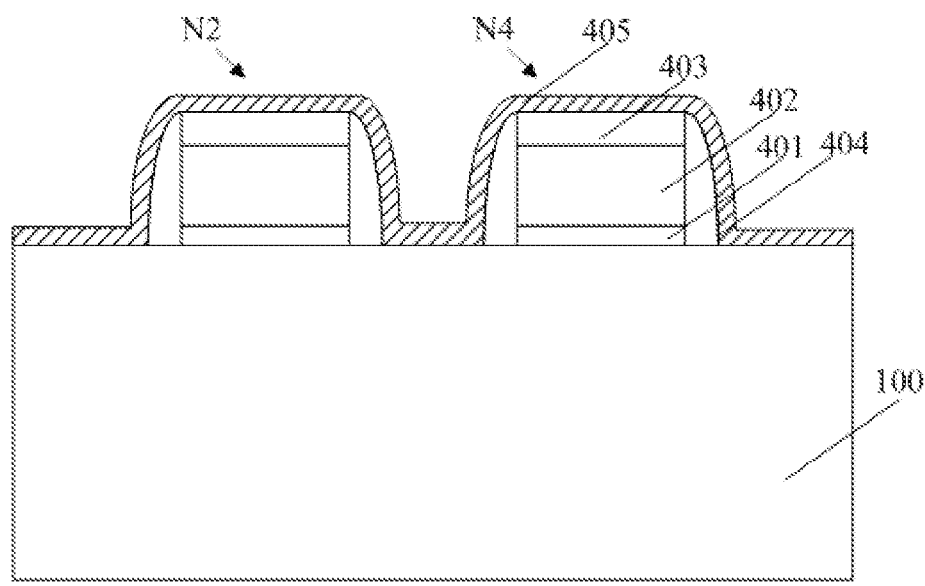
Figure 13:
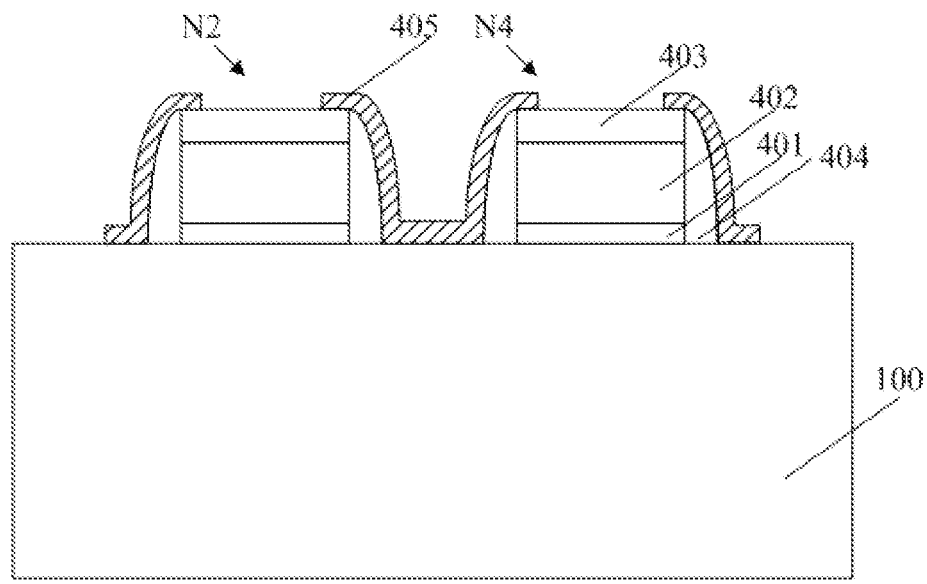

FIGS. 11-13 depict schematic diagrams of another exemplary method for forming a semiconductor structure, e.g., as shown in FIG. 6, in accordance with various disclosed embodiments.

In FIG. 11, a semiconductor substrate 100 can be provided. The semiconductor substrate 100 may be made of silicon, germanium, or other Group III-V semiconductor materials. The semiconductor substrate 100 may also be made of silicon-on-insulator (SOI).

Two adjacent gates can be formed on the semiconductor substrate 100. The two gates can be used to form two connected transistors: a second NMOS transistor N2 and a fourth NMOS transistor N4. Specifically, each of the gates can include a gate dielectric layer 401, a gate electrode layer 402, an insulating layer 403 and a sidewall spacer 404. The gate dielectric layer 401, the gate electrode layer 402 and the insulating layer 403 can be sequentially formed on the semiconductor substrate 100. The sidewall spacer 404 can be formed surrounding the gate dielectric layer 401, the gate electrode layer 402, and the insulating layer 403. A second opening 410 can be formed and surrounded by the sidewalls 404 of the adjacent gates and the semiconductor substrate.

In FIG. 12, a conductive material can be deposited on the two gates and the semiconductor substrate exposed by the gates to form a conductive layer 405. Exemplary conductive material may include one or more of polycrystalline silicon and indium tin oxide. In one example, the conductive material can be polycrystalline silicon, which can be formed using chemical vapor deposition.

A doped region needs to be subsequently formed between the gates. The conductive layer 405 can have a suitable thickness, for example, between about 200 Å and about 800 Å. When the conductive layer 405 is overly thick, it may be difficult to form a doped region therein, e.g., using an ion implantation. On the other hand, when the conductive layer 405 is overly thin, it may reduce reliability of the electrical connection. A portion of the conductive layer 405 can be removed so that the remaining conductive layer 405 can at least partially cover a bottom and a sidewall of the second opening 410.

Doped regions (not shown) of the second NMOS transistor N2 and the fourth NMOS transistor N4 can be respectively formed by doping the semiconductor substrate 100 under the remaining conductive layer 405 via an ion implantation. Alternatively, the second NMOS transistor N2 and the fourth NMOS transistor N4 may share one common doped region. The remaining conductive layer 405 can be used to electrically connect the doped regions of the second NMOS transistor N2 with the fourth NMOS transistor N4.

The doped regions of the second NMOS transistor N2 and the fourth NMOS transistor N4 can be electrically connected via the conductive layer 405 without the need for using connection plugs. Therefore, the distance between the second NMOS transistor N2 and the fourth NMOS transistor N4 can be reduced.

The semiconductor structure depicted in FIGS. 5-6 can be used in an SRAM memory cell to reduce an area of the SRAM memory cell. For example, for embedded SRAM products such as a LCD driver etc., a corresponding chip size can be significantly reduced due to a high proportion of SRAM cells. In one embodiment, the disclosed conductive layer(s) can use a local polycrystalline silicon connection method, instead of using metal connection, to reduce the SRAM cell size. For example, the conductive layer(s) can be connected to the SRAM gate and the source/drain of pull-down/pull-up transistors.

As disclosed, when a SRAM gate region is open, a connection to an adjacent gate and source/drain can be realized. Source/drain of pull-up/pull-down transistors can be connected to a gate of the pull-up/pull-down transistors by the disclosed conductive layer(s). With extension of the conductive layer to enlarge a connection area, drain area contact of the transfer transistor can be connected easily having improved connection margin.

Disclosed herein thus includes a semiconductor structure and a fabrication method thereof. An SRAM memory cell can include at least one semiconductor structure, and an SRAM memory can include at least one SRAM memory cell. An exemplary semiconductor structure can include at least two adjacent transistors formed on a semiconductor substrate. An opening can be formed and surrounded by gates of the two adjacent transistors and a doped region formed between the gates of the two adjacent transistors. A conductive layer can be formed to at least partially cover a bottom and a sidewall of the opening to electrically connect a gate of one transistor with the doped region of the other transistor of the two adjacent transistors.

Electrical connection between electrodes of transistors in each of the semiconductor structure, the SRAM memory cell, and the SRAM memory can be achieved via the disclosed conductive layer(s), without using conventional connection plugs. The space originally reserved for the connection plugs between transistors can be saved, thereby reducing the area of a corresponding SRAM memory cell and thus a corresponding SRAM memory.

Other applications, advantages, alternations, modifications, or equivalents to the disclosed embodiments are obvious to those skilled in the art.

What is claimed is:

1. A semiconductor structure comprising:
   a semiconductor substrate;
   a first transistor and a second transistor formed on the semiconductor substrate,
   the first transistor including:
   a gate electrode layer, and
   an insulating layer contacting on a first portion of a top surface of the gate electrode layer and exposing a second portion of the top surface of the gate electrode layer, and
   the second transistor including:
   a doped region of the second transistor and adjacent to the exposed second portion of the top surface of the gate electrode layer of the first transistor;
   a conductive layer is directly on a portion of a top surface of the insulating layer and exposes a portion of the top surface of the insulating layer, wherein the conductive layer electrically connects the second surface portion of the gate electrode of the first transistor with the doped region of the second transistor, using a material of one of polycrystalline silicon and indium tin oxide, instead of using a metal connection.

2. The structure of claim 1, wherein the conductive layer has a thickness in a range from 200 Å to 800 Å.

3. The structure of claim 1, wherein the conductive layer further covers a sidewall of the insulating layer.

4. The structure of claim 1, wherein the conductive layer covers a first surface portion and exposes a second surface portion of the doped region of the second transistor.

5. The structure of claim 1, wherein the conductive layer covers an entire top surface of the doped region of the second transistor.

6. The structure of claim 1, wherein the conductive layer exposes a first sidewall spacer on one side of the first transistor opposite to the second transistor, wherein the first sidewall spacer is on a sidewall of each of the insulating layer, the gate electrode layer, and a gate dielectric layer.

7. The structure of claim 1, wherein the doped region of the second transistor in the semiconductor substrate is distanced from a sidewall spacer of the first transistor adjacent to the second transistor in a direction parallel to a top surface of the semiconductor substrate.

8. The structure of claim 1, wherein the conductive layer further covers a second sidewall spacer on a sidewall of each of the gate electrode layer, and a gate dielectric layer, adjacent to the second transistor.

9. The structure of claim 1, wherein the doped region is used for a source region or a drain region of the second transistor.

\* \* \* \* \*